(12) United States Patent
Oosterlaken et al.

(10) Patent No.: US 12,366,410 B2
(45) Date of Patent: Jul. 22, 2025

(54) APPARATUS FOR PROCESSING A PLURALITY OF SUBSTRATES PROVIDED WITH AN EXTRACTOR CHAMBER

(71) Applicant: ASM IP Holding B.V, Almere (NL)

(72) Inventors: Theodorus G. M. Oosterlaken, Oudewater (NL); Adriaan Garssen, Doorn (NL); Herbert Terhorst, Amersfoort (NL); Lucian Jdira, Nieuw Vennep (NL)

(73) Assignee: ASM IP Holding B.V., Almere (NL)

( * ) Notice: Subject to any disclaimer, the term of this patent is extended or adjusted under 35 U.S.C. 154(b) by 408 days.

(21) Appl. No.: 17/810,759

(22) Filed: Jul. 5, 2022

(65) Prior Publication Data
US 2023/0008684 A1      Jan. 12, 2023

Related U.S. Application Data

(60) Provisional application No. 63/218,648, filed on Jul. 6, 2021.

(51) Int. Cl.
| | | |
|---|---|---|
| H01L 21/67 | (2006.01) | |
| F27B 5/16 | (2006.01) | |
| F27B 17/00 | (2006.01) | |

(52) U.S. Cl.
CPC ............ F27B 17/0025 (2013.01); F27B 5/16 (2013.01); H01L 21/67109 (2013.01); *F27B 2005/165* (2013.01)

(58) Field of Classification Search
CPC ................................ F27B 17/0025; F27B 5/16
See application file for complete search history.

(56) References Cited

U.S. PATENT DOCUMENTS

| | | | | |
|---|---|---|---|---|
| 4,816,098 A | * | 3/1989 | Davis ................ | H01L 21/67748 156/345.31 |
| 4,911,103 A | * | 3/1990 | Davis .................... | C30B 35/005 118/728 |
| 6,098,341 A | * | 8/2000 | Gebauer ............... | E05F 15/652 49/362 |

(Continued)

FOREIGN PATENT DOCUMENTS

| | | |
|---|---|---|
| JP | 5595963 B2 | 9/2014 |
| KR | 100752148 B1 | 8/2007 |
| KR | 100873830 B1 | 12/2008 |

OTHER PUBLICATIONS

Nov. 23, 2022—(EP) Extended Search Report—EP App. 22183052.4.

*Primary Examiner* — Steven S Anderson, II
(74) *Attorney, Agent, or Firm* — Banner & Witcoff, Ltd.

(57) ABSTRACT

An apparatus 1 for processing a plurality of substrates 3 is provided. The apparatus may have a process tube 5 creating a process chamber 7; a heater 9 surrounding the process tube 5; a flange 11 for supporting the process tube; and a door 15 configured to support a wafer boat 17 with a plurality of substrates 3 in the process chamber and to seal the process chamber 7. An exhaust operably connected to the process chamber 7 may be provided to remove gas from the process chamber via a first exhaust duct 19. The apparatus may be provided with an extractor chamber 21 surrounding the first exhaust duct where it connects to the process chamber and connected to a second exhaust duct 23 to remove gas from the extractor chamber.

17 Claims, 1 Drawing Sheet

(56) References Cited

U.S. PATENT DOCUMENTS

| | | | | |
|---|---|---|---|---|
| 2001/0049080 | A1* | 12/2001 | Asano | C23C 16/452 432/247 |
| 2003/0050004 | A1* | 3/2003 | Schottler | F24F 3/167 454/187 |
| 2006/0223328 | A1* | 10/2006 | Utsunomiya | F27B 17/0025 438/689 |
| 2009/0035463 | A1* | 2/2009 | Dip | H01L 21/67098 427/255.28 |
| 2009/0245761 | A1* | 10/2009 | Nakajima | F27B 17/0025 392/416 |
| 2014/0287375 | A1* | 9/2014 | Kosugi | F27D 9/00 438/795 |
| 2019/0330740 | A1* | 10/2019 | Klaver | C23C 16/4557 |
| 2024/0128065 | A1* | 4/2024 | Bae | H01L 21/67 |

\* cited by examiner

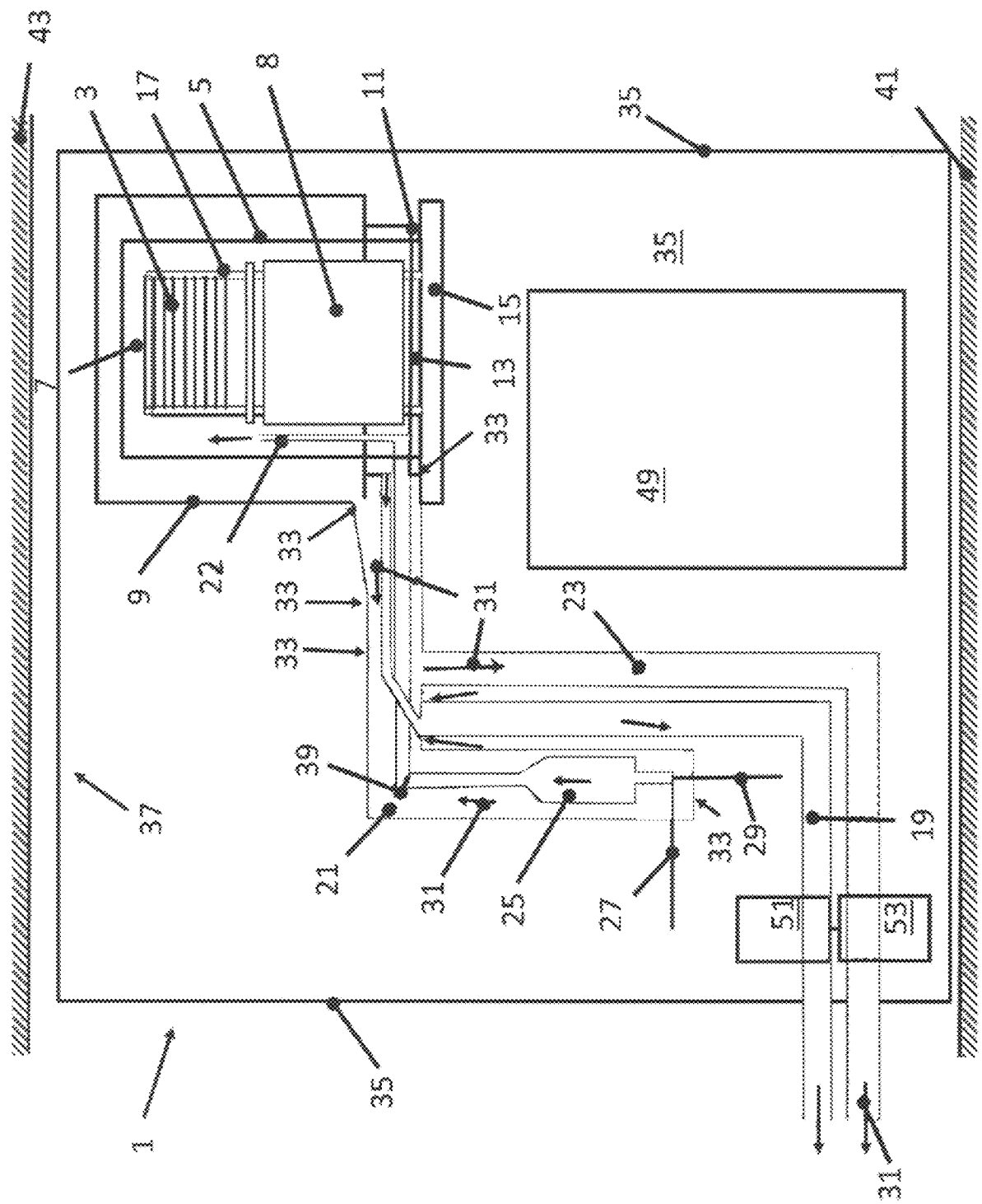

APPARATUS FOR PROCESSING A PLURALITY OF SUBSTRATES PROVIDED WITH AN EXTRACTOR CHAMBER

FIELD

The disclosure relates to an apparatus for processing a plurality of substrates. More in particular the disclosure relates to an apparatus, comprising;
- a process tube creating a process chamber;
- a heater surrounding the process tube;
- a flange for supporting the process tube;
- a door configured to support a wafer boat with a plurality of substrates in the process chamber; and,
- an exhaust operably connected to the process chamber to remove gas from the process chamber.

BACKGROUND

Semiconductor substrates can be processed in batches in vertical furnaces. An example of such processing is the reaction of layers of various materials on the substrates in a process chamber.

The process tube creating the process chamber may be positioned within a substantially closed cabinet. The cabinet may be provided with an extractor hood to extract any gases that may leak from any of the tubes connected to the process chamber. It has been found that a flow of gas may need to be pumped from the cabinet to assure that no gasses will leak from the cabinet which may prove costly.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an objective to provide an apparatus in which less gas may need to be pumped away while preventing substantial gas leakage from the apparatus.

According to an aspect there may be provided an apparatus for processing a plurality of substrates. The apparatus may have a process tube creating a process chamber, a heater surrounding the process tube for heating the process chamber, and a flange for supporting the process tube and provided with a flange opening giving access to an opening of the process tube. The apparatus may have a door configured to support a wafer boat with a plurality of substrates in the process chamber and to seal the process chamber and an exhaust operably connected to the process chamber to remove gas from the process chamber via a first exhaust duct. The apparatus may be provided with an extractor chamber surrounding the first exhaust duct where it connects to the process chamber and connected to a second exhaust duct to remove gas from the extractor chamber.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached FIGURE, the invention not being limited to any particular embodiment(s) disclosed.

BRIEF DESCRIPTION OF THE FIGURE

While the specification concludes with claims particularly pointing out and distinctly claiming what is regarded as embodiments, the advantages of embodiments of the disclosure may be more readily ascertained from the description of certain examples of the embodiments of the disclosure when read in conjunction with the accompanying drawing, in which:

FIG. 1 is a schematic and cross-sectional side view on a process tube of a vertical furnace in a closed condition.

DETAILED DESCRIPTION OF THE FIGURE

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "substrate" or "wafer" may refer to any underlying material or materials that may be used, or upon which, a device, a circuit, or a film may be formed. The term "semiconductor device structure" may refer to any portion of a processed, or partially processed, semiconductor structure that is, includes, or defines at least a portion of an active or passive component of a semiconductor device to be formed on or in a semiconductor substrate.

Semiconductor substrates can be processed in batches. FIG. 1 illustrates schematically a portion of an exemplary batch reactor. The illustrated reactor may be a vertical furnace type of reactor, which has benefits for efficient heating and loading. FIG. 1 is a schematic and cross-sectional side view on a process tube 5 of an apparatus 1 for processing a plurality of substrates 3 e.g. vertical furnace in a closed condition. The apparatus may have a process tube 5 creating a process chamber 7.

The process tube 5 may be open at the bottom and closed at the top in a dome shape (not shown). A heater 9 may surround the process tube 5 for heating the process tube 5. A pedestal 8 may support a wafer boat 17, which holds a plurality of wafers 3, preferably between 50 and 200 wafers in the process chamber 7. The pedestal 8 may be thermally insulating, to prevent undue heating of a surrounding part of the vertical furnace including a door 15 supporting the pedestal 8.

The process tube 5 may have a base which may be supported on a flange 11. Additional flanges 11 may be used surrounding the process tube 5 to seal it off. Flanges 11 may also be used to support other components in the process tub such as injectors or liners. The flange 11 for supporting the process tube 5 may be provided with a flange opening 13 giving access to an opening of the process tube 5. A wafer boat 17 of wafers 3 may be moved into the process chamber 7 via the flange opening 13 while being supported on the door 15. At the end of the movement the door while supporting the wafer boat 17 with a plurality of substrates 3 in the process chamber the door 15 may seal the process chamber 7. The apparatus may have an exhaust operably connected to the process chamber 7 to remove gas from the process chamber via a first exhaust duct 19. The apparatus may be provided with an extractor chamber 21 surrounding the first exhaust duct 19 at least where it connects to the process chamber 7.

The extractor chamber 21 may be connected to a second exhaust duct 22 to remove gas from the extractor chamber 21. In this way any gases that may leak out of the process chamber, the heater 9 or the first exhaust duct 19 may be pumped away with the pump 53.

The extractor chamber 21 may be provided with a gas injection tube 22 operably connected to the process chamber to provide process gas into the process chamber 7. By connecting the gas injection tube 22 to the process chamber 7 via the extractor chamber 21 leakage of process gas into the rest of the apparatus 1 may be prevented.

The extractor chamber 21 may be provided with a process gas production unit 25 operably connected to the gas injection tube 22 and the process chamber to produce process gas and to provide it into the process chamber 7. By providing the gas production unit 25 in the extractor chamber 21 may prevent leakage of process gas into the rest of the apparatus 1 if the gas production unit 25 may leak.

The process gas production unit 25 may be operably connected to a first production gas line 27 and/or a second production gas line 29. The first production gas line 27 may be constructed and arranged to provide hydrogen. The second production gas line 29 may be constructed and arranged to provide oxygen. The process gas production unit 25 may produce water as the process gas. High purity water may be produced from the reaction between hydrogen and oxygen to provide it into the process chamber 7 via the gas injection tube 22. By connecting the first and second production gas line 27, 29, to the gas production unit 25 in the extractor chamber 21 leakage of production gases into the rest of the apparatus 1 may be circumvented if the connection may leak.

The extractor chamber 21 may be provided with openings (not shown) to create a flow 33 which creates a flow 31 in the extractor chamber 21 and the second exhaust duct 23. The second exhaust duct 23 may be connected to a second pump 53 to remove gases from the extractor chamber 21. The openings may be small and therefore difficult to show in the FIGURE. The openings may be provided near any passages through a wall of the extractor chamber 21. The openings may be cracks near any passages through a wall of the extractor chamber 21. The cracks may be in the wall of the extractor chamber 21 at connections. Allowing cracks makes it easier to design the extractor chamber 21 and it allows also for thermal expansion of components of the apparatus 1. The passages may allow any tubes to transport gas from the internal ducts of the extractor chamber 21 to outside with some tolerance of manufacturing and hence creating opening for the flow 33 into the extraction chamber 21. The openings may be provided near the connection of the first exhaust duct 19 with the process chamber 7 and/or near the connection of the extractor chamber 21 with the second exhaust duct 23. The flows 33, 31 may transport any leaking gasses to the second exhaust duct 23.

The openings may be provided near the connection of the heater 9 and the extractor chamber 21. Any space within the heater 2 may be connected to the extractor chamber 21. Any outgassing products of the heater 2 may be pumped away with the pump 53 via the extractor chamber 21 and the second exhaust 23.

The apparatus may be provided with a sidewall 35 to limit access to the apparatus 1. The apparatus may be provided with a plurality of sidewalls 35 to create an open box which is open at the top 37.

Also the bottom may be left open. At the bottom drop collection buckets may be provided optionally to collect any leaking liquids. The open box structure may function as a protective cover protecting the inside of the apparatus 1. This may be done for safety purpose.

Since the open box structure may not need a ceiling there is more space for the process chamber 7 between the floor 41 and the ceiling 43 of the semiconductor manufacturing site where the apparatus 1 may be used. The process chamber 7 may accordingly become bigger and more wafers may be processed in the process chamber 7 in one go making the apparatus 1 more economic. Equally the apparatus 1 may be provided with sidewalls 35 at the front and back. The sidewalls 35 may be connected to provide the open box structure.

The apparatus 1 may be provided with a tool door 49 in the sidewall 35 giving access for maintenance. Maintenance worker may access the tool via the tool door 49.

The extractor chamber 21 may be provided with an extractor chamber door for giving access to the process gas production unit 25, first exhaust duct 19 and/or any other device in the extractor chamber 21. Maintenance worker may access the process gas production unit 25, first exhaust duct 19 and/or any other device in the extractor chamber 21 via the extractor door.

The apparatus may be provided with a measurement device and at least the part connecting to the process chamber 7 may be provided in the extractor 21 chamber. Leakage of process gas near the measurement device may flow via the extractor chamber 21 in the second exhaust duct 23.

The apparatus may be provided with a valve 39. The valve 39 may be for (partly) closing the gas flow through the gas injection tube 22. At least a part of the valve 39 may be provided in the extractor chamber 21 so that any leakage of process gas near the valve 39 may flow in the second exhaust duct 23.

A part of the valve 39 may be provided in a gas injection tube 23, the first or second exhaust duct 19, 23 or a production gas line 27, 29. Another part of the valve 39 may extend through a wall of the extractor chamber 21 to outside said chamber 21 for ease of controlling the valve. Again any gas leakage around the valve 39 may disappear in the second exhaust duct 23.

The process chamber 7 may be an atmospheric process chamber operated at a pressure between 0.9 and 1.1 Atm, preferably 0.98 and 1.02 Atm. These atmospheric process chambers may be sensitive to leakage since they are not substantially over pressurized. The first exhaust duct 19 may be connected to pump 51 to remove gases from the process chamber 7. The pump 51 may be controlled to maintain the pressure between 0.9 and 1.1 Atm, preferably 0.98 and 1.02 Atm.

An elevator (not shown) may be provided to move, e.g., lift or lower, the door 15, pedestal 8 and wafer boat 17 to load or unload the wafer boat 17. Gases, including inert and reactive precursor gases, may be provided to the process chamber 7 from gas sources, which may comprise a plurality of containers for holding various gases. A gas opening (not shown) may be provided in the flanges 11 to provide the gas from the gas source to the process chamber 7 with for example an injector and duct. A gas opening in the flange 11 may also be used to remove gases from the process chamber 7. Also gas opening through the process tube 5 may be used to provide and/or remove gasses from the process chamber 7 with for example an injector and duct.

Although illustrative embodiments of the present invention have been described above, in part with reference to the accompanying drawing, it is to be understood that the invention is not limited to these embodiments. Variations to the disclosed embodiments can be understood and effected by those skilled in the art in practicing the claimed invention, from a study of the drawing, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A system for processing a plurality of substrates, comprising;
   a process tube creating a process chamber;
   a heater surrounding the process tube for heating the process chamber;
   a flange for supporting the process tube and comprising a flange opening giving access to an opening of the process tube;
   a door configured to support, in the process chamber, a wafer boat with a plurality of substrates and to seal the process chamber;
   a first exhaust duct operably connected to the process chamber and configured to remove gas from the process chamber;
   an extractor chamber operably connected to a space between the process chamber and the heater and comprising:
      at least a portion of the first exhaust duct;
      at least a portion of a gas injection tube operably connected to the process chamber to provide process gas into the process chamber;
      a process gas production unit operably connected to the gas injection tube and configured to provide process gas into the process chamber; and
      a second exhaust duct configured to remove both first gas from the space and second gas leaked from the process gas production unit in the extractor chamber, wherein the second exhaust duct is not connected to the first exhaust duct, and wherein a first gas flow in the first exhaust duct is different from a second gas flow in the second exhaust duct.

2. The system of claim 1, wherein the process gas production unit is operably connected to a first production gas line.

3. The system of claim 1, wherein the process gas production unit is provided with a first production gas line and a second production gas line.

4. The system of claim 3, wherein the first production gas line is arranged to provide hydrogen.

5. The system of claim 3, wherein the second production gas line is arranged to provide oxygen.

6. The system of to claim 1, wherein the process gas comprises hydrogen and oxygen.

7. The system of claim 1, wherein the extractor chamber is provided with openings to create a flow in the extractor chamber and the second exhaust duct.

8. The system of to claim 7, wherein the openings are provided at one of the connections of:
   the first exhaust duct with the process chamber; and
   the extractor chamber with the second exhaust duct.

9. The system of claim 1, wherein the system is provided with a sidewall to limit access to the system.

10. The system of claim 9, wherein the system is provided with a plurality of sidewalls.

11. The system of claim 9, wherein the system is provided with a door in the sidewall giving access for maintenance.

12. The system of claim 1, wherein the extractor chamber is provided with an extractor door for giving access to at least one of the process gas production unit, first exhaust duct and any other device in the extractor chamber.

13. The system of claim 1, wherein the extractor chamber further comprises a valve.

14. The system of claim 13, wherein a part of the valve is provided in a gas injection tube, the first exhaust duct, the second exhaust duct, or a production gas line.

15. The system of claim 1, wherein the process chamber is an atmospheric process chamber operated at a pressure between 0.9 and 1.1 atmosphere (Atm).

16. The system of claim 1, wherein the first gas comprises gas leaked from the heater or the process chamber.

17. The system of claim 1, wherein the second gas further comprises gas leaked from the portion of the first exhaust duct and the portion of the gas injection tube.

* * * * *